United States Patent [19]

West

[11] Patent Number: 4,679,001
[45] Date of Patent: Jul. 7, 1987

[54] ADAPTIVE STOP-NOTCH FILTER

[75] Inventor: Lynn P. West, Austin, Tex.

[73] Assignee: International Business Machines Corporation, Armonk, N.Y.

[21] Appl. No.: 786,912

[22] Filed: Oct. 11, 1985

[51] Int. Cl.$^4$ .............................................. H03B 1/04
[52] U.S. Cl. .................................. 328/167; 307/520; 307/529; 328/160
[58] Field of Search ............... 328/160, 167; 307/529, 307/520

[56] References Cited

U.S. PATENT DOCUMENTS

| 3,531,652 | 9/1970 | Aemmer et al. | 307/105 |
| 3,628,057 | 12/1971 | Mueller | 307/105 |
| 3,912,916 | 10/1975 | Grun et al. | 328/167 |
| 3,967,102 | 6/1976 | McCown | 328/167 |
| 4,182,997 | 1/1980 | Brambilla | 333/175 |
| 4,223,272 | 9/1980 | Feistel | 330/51 |
| 4,349,916 | 9/1982 | Roeder | 328/167 |
| 4,495,475 | 1/1985 | Mark et al. | 328/167 |

Primary Examiner—John S. Heyman
Attorney, Agent, or Firm—J. F. Villella, Jr.

[57] ABSTRACT

A filter suppresses energy at time varying or ensemble varying frequencies. The filter comprises multiplier sections having sets of values which are dynamically varied during the receipt of time varying or ensemble varying energy. The variation of the values of the multiplier sections provides the suppression of energy at the time varying or ensemble varying frequencies. The sets of values for the multiplier sections are chosen such that the poles of such values lie within the unit circle of the z-plane locus. The location of the poles within the unit circle guarantees that the filter remain stable even though the multipliers may be located in a feedback path. In the preferred embodiment, the dynamically varying filter is used in a dual tone multi-frequency (DTMF) receiver.

7 Claims, 5 Drawing Figures

ADAPTIVE STOP-NOTCH FILTER

TECHNICAL FIELD

The present invention relates to a stop-notch filtering function, and more particularly, to one which can adaptively suppress energy at time varying or ensemble varying frequencies.

BACKGROUND ART

Typical communication systems include infinite impulse response (IIR) filters for suppressing energy at selected frequencies. Such a filter comprises one or more individual filter sections with each section having a pair of multipliers connected in parallel with an adder. The specific characteristics of any given filter section are determined by the values of the multipliers. For example, the multiplier values may be chosen so as to perform a band stop function for high band frequencies or a band stop function for low band frequencies.

The selection of the specific values of the multipliers in a filter section is well documented in the prior art for a large number of fixed filter functions. The selection of these multiplier values must be carefully made because the multipliers are in a feedback path. If the selection of the multiplier values is done without some care, unstable operation of the filter can result. The potential instabilities associated with multiplication in a feedback system is also well known in the prior art. See for example, *Feedback Control System Analysis and Synthesis,* D'Azzo and Houpis, McGraw-Hill, N.Y., 1960.

There are several applications which require the suppression of energy at time varying or ensemble varying frequencies. Examples of such applications include the detection of call progress signals on a telephone line; carrier detection in a modem; discrimination in a modem; automatic equalization of predistorted signals; and, the detection of dual tone multi-frequency (DTMF) tones in a telephone system. For these time varying or ensemble varying frequencies, fixed filters may not be suitable.

U.S. Pat. No. 4,223,272 discloses a four terminal network selectively convertible into a low pass, high pass, band pass, all pass, or band stop filter. The four terminal network has a transfer function substantially satisfying a quadratic equation, wherein the coefficients of the quadratic equation may be changed to alter the function of the network. The coefficients of the quadratic equation are altered by changing the values of resistances in a network. These resistances are switchable but only to the extent of converting the four terminal network from one form of filter to another. The resistances are not dynamically switchable to alter the filter characteristics on a dynamic basis for either a time varying or ensemble varying frequency.

U.S. Pat. No. 4,182,997 describes a filter for a telecommunication system designed to suppress a first signal frequency and to transmit an adjoining second signal frequency without significant attenuation. The frequencies at which the pass and stop functions are performed depend upon the values of a first and a second capacitor and a first and a second inductor. Similarly, U.S. Pat. No. 3,531,652 discloses an active filter circuit that is adapted to filter functions to pass a source frequency with very little attenuation while attenuating other frequencies. Additionally, U.S. Pat. No. 3,628,057 discloses an active narrow notch filter to filter out noise signals. However, none of these prior art references discloses a filter which is dynamically variable so as to suppress energy at either time varying or ensemble varying frequencies.

DISCLOSURE OF THE INVENTION

Accordingly, it is an object of this invention to provide an improved filter.

It is another object of this invention to provide a filter for suppressing energy at either time varying or ensemble varying frequencies.

It is yet another object of this invention to provide an adaptive stop notch filter which is dynamically variable during operation.

In accordance with these and other objects of the invention, a stop notch filter is disclosed wherein the values of the multipliers comprising the filter may be dynamically varied during operation so as to suppress energy at time varying or ensemble varying frequencies. A first set of multipliers is chosen and a second set of multipliers is chosen such that both sets produce stable filter sections. The set in use may be toggled at any rate without instabilities provided that the z-plane locus between the poles of the two sets is within the unit circle at all points. In the preferred embodiment disclosed herein, the dynamically adaptable filters are used as band stop filters in a dual tone multi-frequency (DTMF) receiver. One of these band stop filters is a low band stop filter which attenuates each of the low frequency DTMF tones by 40 db. A high band stop filter similarly attenuates high frequency DTMF tones by 40 db.

BEST MODE FOR CARRYING OUT THE INVENTION

Figure 1:
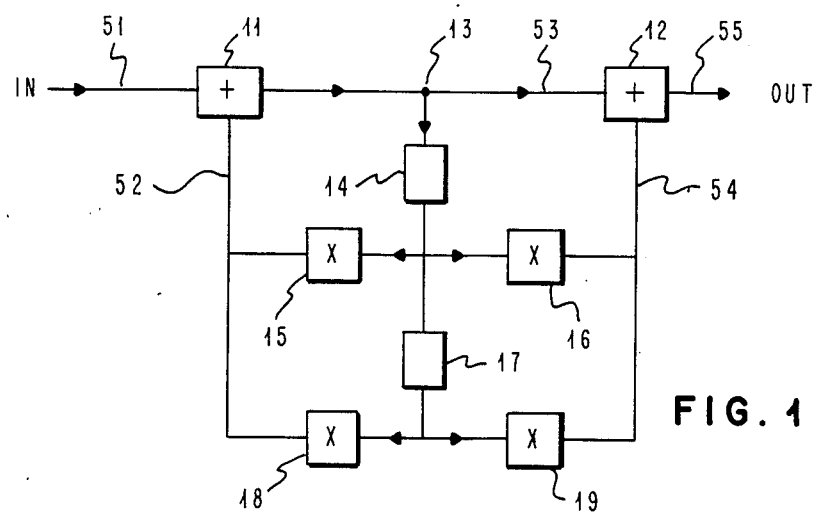
FIG. 1 is an infinite impulse response (IIR) filter used in the present invention.

A typical infinite impulse response (IIR) filter section 10 is shown in FIG. 1. Such a filter section includes four multipliers 15, 16, 18 and 19 as well as adders 11 and 12. Given such a filter section 10 as shown in FIG. 1, any one of several filter functions may be formed depending on the values given to the four multipliers 15, 16, 18, and 19. As can be seen, multipliers 15 and 18 are connected in a feedback path while multipliers 16 and 19 are connected in a forward path. Thus, the inputs to adder 11 are filter input 51 and line 52, which is the output of multipliers 15 and 18. Delay block 14 is connected between point 13 and the input of multipliers 15 and 16. Delay block 17 is connected between the inputs of multipliers 15 and 16 and the inputs of multipliers 18 and 19.

Figure 3:
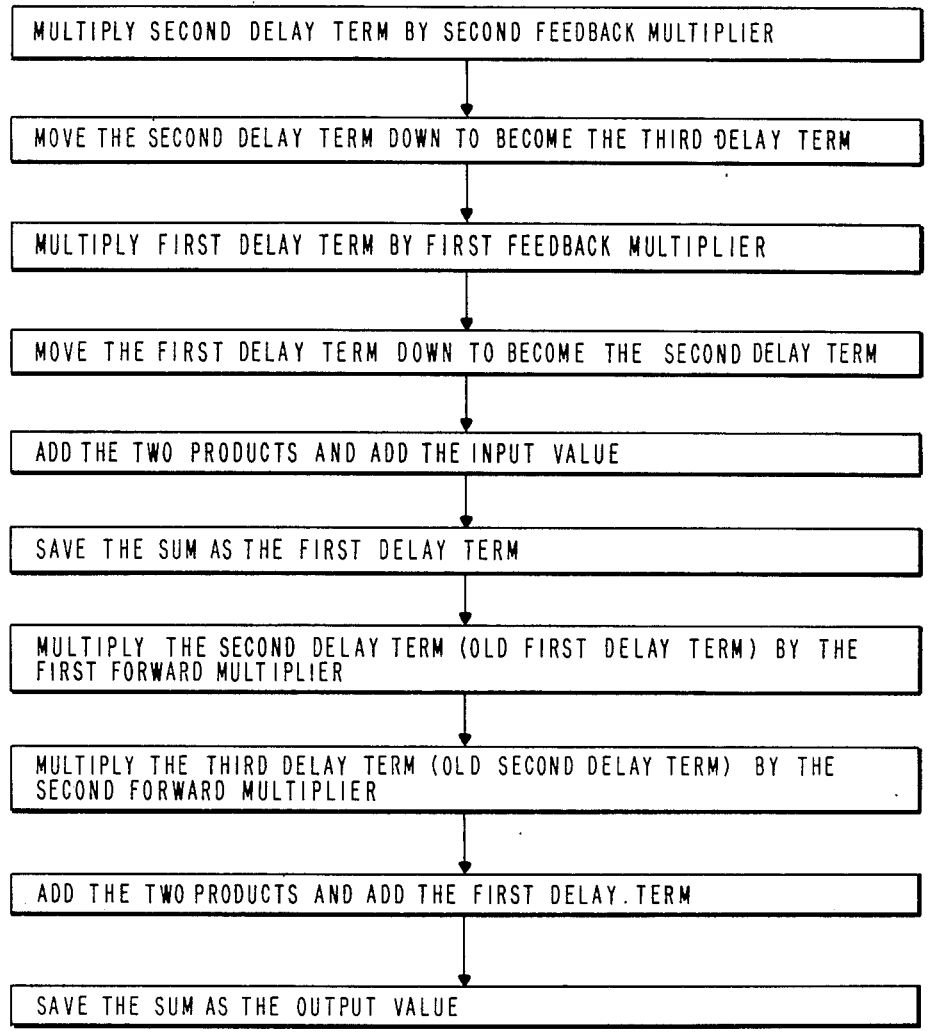
FIG. 3 is a flow chart depicting the operation of the filter of FIG. 1.

The input sample to filter section 10 is line 51. The output of adder 11 then becomes filter input 51, plus the product of multiplier 18 times delay block 17, plus the product of multiplier 15 times delay block 14. The output of adder 12 is then equal to the output 13 of adder 11, plus the product of multiplier 16 times delay block 14, plus the product of multiplier 19 times delay block 17. The selection of the values of multipliers 15, 16, 18 and 19 is well known in the prior art for a plurality of fixed filtering functions. The selection of the values for multipliers 15 and 18 must be carefully made in order to avoid unstable operation of such a filter since multipliers 15 and 18 are located in a feedback path with adder 11. Filter section 10 may be cascaded with other such filter sections so as to provide more complex filtering functions. The above operation of filter section 10 is detailed in FIG. 3.

The values of multipliers 15, 16, 18 and 19 may be dynamically varied during operation, i.e., while input signals are being provided to filter input 51, without resulting instability. Assuming that a first set of values are chosen for multipliers 15, 16, 18 and 19, and a second set of values is chosen for such multipliers, then the operation of filter section 10 may be toggled between the two sets of values for such multipliers. The set of values in use for multipliers 15, 16, 18 and 19 may be toggled or dynamically varied at any rate between the chosen value sets without instability provided that the z-plane locus between the poles of the two sets of values is within the unit circle at all points. This will be shown in more detail in conjunction with FIG. 4. The operation of selecting the sets of values for the multiplier sections is shown in the flow chart of FIG. 5.

For a function f(t), a complex variable s may be defined such that $$F(s) = \int_0^\infty f(t) \exp(-st) \, dt \qquad \text{Equation 1}$$

The function F(s) is a complex variable, commonly referred to as the Laplace Transform of f(t). For $s = \sigma + j\omega$, it can be shown that any realizable electronic network may be characterized in terms of an F(s). Application of some input signal, i(t) to the resulting f(t) will produce an output o(t) The character of o(t) may be determined by computing the Laplace Transforms of i(t) and f(t) to obtain I(s) and F(s); multiplying the latter two together; and, then performing the inverse Laplace Transform to the product to obtain o(t).

These characteristics of the Laplace Transform are well documented in the prior art as is Nyquist's Stability Criterion which states that for a network to be stable, the denominator of $$F(s) = N(s)/D(s), \qquad \text{Equation 2}$$

namely, D(s), must have zeroes only for values of s such that $\sigma$ is less than zero, where D(s) is a polynomial in s of the form $$D(s) = d1s + d2s^2 + d3s^3 + d4s^4 \ldots$$

Figure 4:
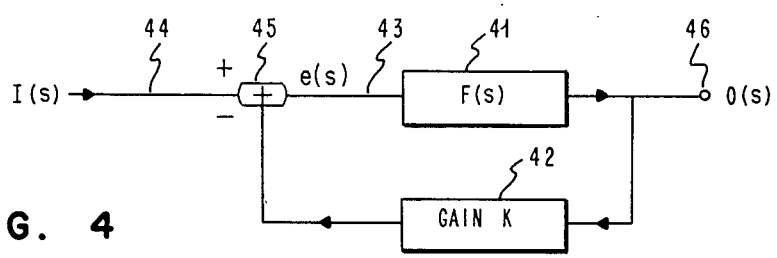
FIG. 4 is a block diagram of a feedback control system in which the poles of the system move as the system gain increases.
Figure 5:
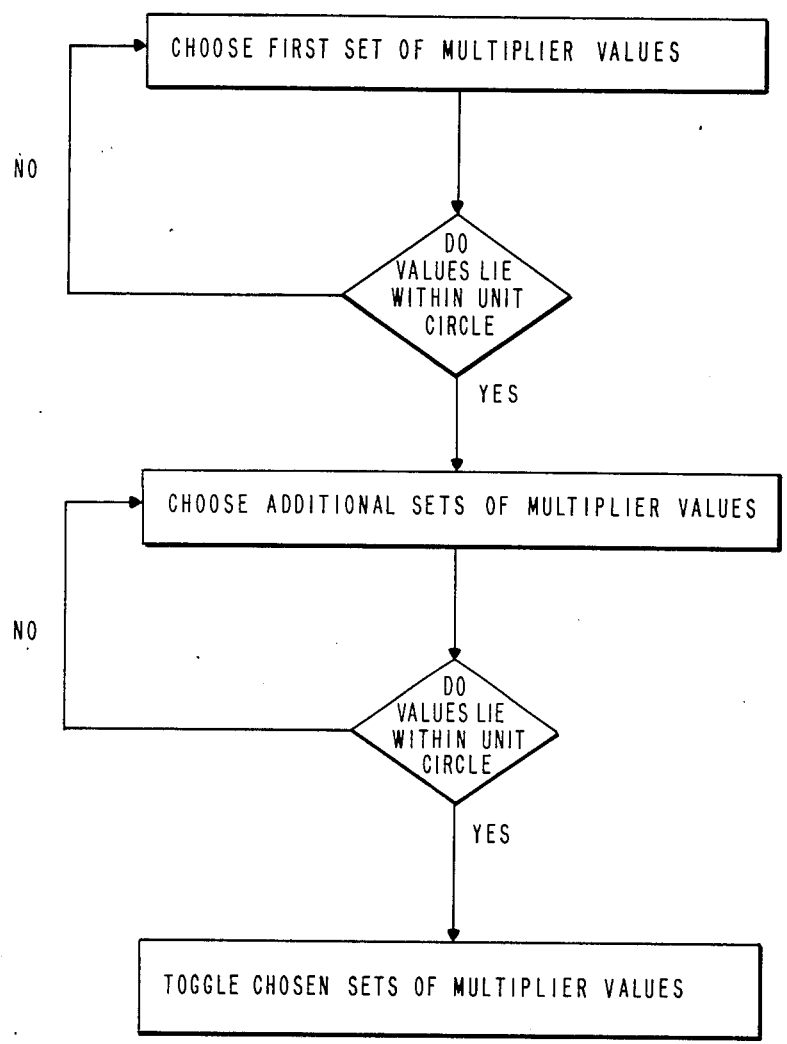
FIG. 5 is a flow chart depicting the selection of multiplier values for a biquad filter according to FIG. 1.

For a system 40 such as shown in FIG. 4 using feedback with gain K, 42, and with a forward transfer function F(s), 41, the transfer function is given by O(s) = e(s) F(s)  Equation 3, where O(s) is the output, 46, and e(s) is the error function, 43, appearing at the output of adder 45 and the input of forward transfer function 41.

Error function 43 is given by $$e(s) = O(s)K + I(s), \qquad \text{Equation 4,}$$

where I(s) is the input 44 of the system 40.

O(s) is equal to [I(s) − K O(s)]F(s) so that O(s) + KO(s) F(s) = I(s) F(s), and O(s) [1 + KF(s)] = I(s) F(s), and $$O(s)/I(s) = F(s)/[1 + KF(s)] \qquad \text{Equation 5,}$$

which is the transfer function of the system shown in FIG. 4.

Substituting Equation 2 into Equation 5 gives the transfer function as $$O(s)/I(s) = \frac{N(s)/D(s)}{1 + KN(s)/D(s)},$$

from which the transfer function is given by $$O(s)/I(s) = N(s)/D(s) + K\, N(s). \qquad \text{Equation 6}$$

From Equation 6, it can be seen that the open loop system, i.e., K equal to zero, is just F(s). It can also be seen that as the value of gain K, 42, increases, the zeroes of the transfer function remain fixed but that the poles of the transfer function change. For extremely large values of gain K 42, the denominator of Equation 6 becomes quite small so that the transfer function goes to unity. The poles of Equation 6 move towards the zeroes as the value of gain K, 42, increases. As long as the poles remain in the left hand plane, i.e., sigma less than zero, the system shown in FIG. 4 remains stable.

In the Laplace domain, a unit of fixed delay T has a transfer function F(s) = exp (sT). The Z transform of this function is defined as Z = exp (sT)

which is $$z = exp\, (\omega + j\, \omega)T.$$

For sigma and omega both equal to zero, Z is equal to exp(0), or 1. For sigma equal zero and omega equal to $2\pi/T$, z is equal to exp(j2$\pi$), while for sigma equal to a value of K greater than zero, and omega equal to zero, then z is equal to exp(K). For sigma equal to K and for any value of omega, x, then z = exp(K + jx) = exp(k) exp(jx). Finally, for sigma equal to −K and omega equal to any value x less than $2\pi/T$, then $$z = exp(jx - K) = exp(jx)/exp(k).$$

As can be seen from the above, z equal 1 is one unit positive with no imaginary term. When sigma equals zero and omega equals $2\pi/T$, z is equal to −1 with no imaginary term. For sigma equal to K and omega equal to 0, z is a real positive number greater than zero. For sigma equal to K and omega equal to x, z is a complex variable of arbitrary angle and value greater than unity. And finally, for sigma equal to minus K and omega equal to x, z is a complex variable of arbitrary angle and value less than unity.

When sigma equals K (greater than zero) and omega equals any x, the values of sigma and omega define the right half of the s-plane. For sigma equal to minus K and omega equal to x, these values define that portion of the left half of the s-plane in which omega is restricted to $2\pi/T$. Thus for frequencies less than $1/T$, the poles of s in the left half plane are mapped into a unit circle in the z-plane. Poles inside that circle are stable as shown by Equations 2 and 6 above. By inverse transform, z-plane poles within the unit circle will map into s-plane poles to the left of the omega axis and to frequencies less than $1/T$. By equivalence to Equations 2 and 6, poles moving along any locus within the unit circle are thus stable.

Figure 2:
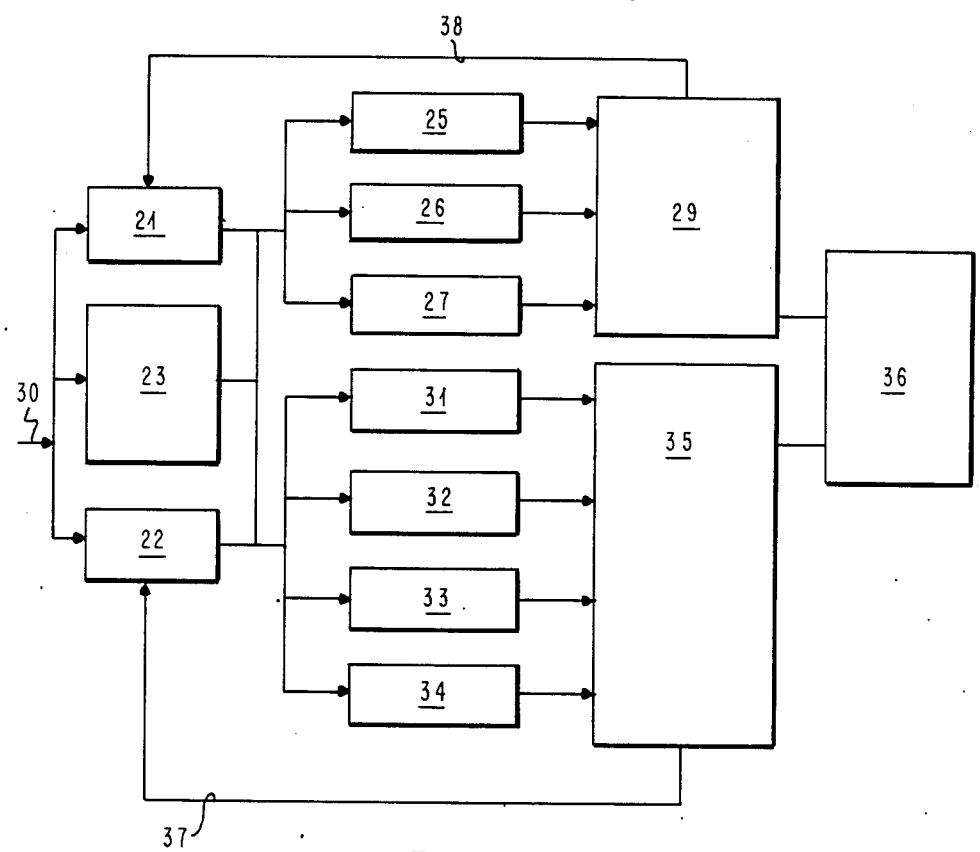
FIG. 2 is a block diagram of a dual tone multi-frequency (DTMF) receiver using the filter of FIG. 1.

An application for the dynamically variable filter of FIG. 1 is shown in FIG. 2 which is a DTMF receiver. The DTMF receiver 20 of FIG. 2 includes a band-stop low-band filter 21 and a band-stop high-band filter 22 which employ the filter configuration and dynamic variation of FIG. 1 and FIG. 4. Element 23 provides automatic gain control (AGC) to DTMF receiver 20, while elements 25, 26 and 27 are high band resonators. Elements 31 through 34 function as low band resonators, while elements 29 and 35 are decision machines. Finally, element 36 is a state machine.

As stated previously, in DTMF receiver 20 are low band stop filter 21 and high band stop filter 22. Low band stop filter 21 is required to attenuate low frequency tones by 40 db. while high band stop filter 22 must attenuate high frequency tones by 40 db. In each signal path of DTMF receiver 20 is an amplitude limiter (not shown) which immediately follows the stop band filter for that band. In other words, there is a low band amplitude limiter following filter 21 and a high band amplitude limiter following filter 22. The purpose of each of these limiters is to splatter energy received during speech at the input 30. This splattering process spreads the speech energy more equally between the resonators 25 through 27 and 31 through 34 so that no one resonator is likely to be sufficiently energized by the input speech to cause either of decision machines 29 or 35 to report that a DTMF tone has been detected.

During DTMF tone signaling, band stop filters 21 and 22 remove one of the two received tones, either the high or low one, so that only a single frequency tone is presented to the amplitude limiters. Given a single frequency tone, the splatter generated by the amplitude limiter consists of all the odd harmonics of the input tone frequency. Since resonators 25 through 27 and 31 through 34 are chosen to avoid this odd harmonic effect, no one of such resonators is sensitive to the odd harmonics of any DTMF tone. As a result, the effect of these amplitude limiters during DTMF tone signaling is minimal. If the band stop filters 21 and 22 do not sufficiently reduce the unwanted tones prior to inputting the speech energy to the amplitude limiters, then the output of the amplitude limiters consists of all the intermodulation products of the two tones. As a result, more than one resonator is likely to become sufficiently resonant so that the tone will not be recognized by decision machines 29 or 35.

It has been recognized that even in the absence of band stop filters 21 and 22, a resonator can become predominantly active, i.e., it will produce a higher output than the other resonators for all valid DTMF tones. Consequently, the output of such resonator cannot be used as a positive indication of tone detection. To overcome this, decision machines 29 and 35 perform a dual function. The first function is to report when one of the outputs of resonators 25 through 27 or 31 through 34 is sufficiently predominant so that a tone can be claimed as being detected. The second function performed by decision machines 29 and 35 is to provide an indication to stop band filters 21 and 22 that a given one of the resonators 25 through 27 or 31 through 34 is dominant by even a small margin over the others in the particular frequency band. This signaling path is cross coupled, i.e., the predominant low tone is signaled to the band stop filter which is in the high band path and vice versa. That is, the predominant low tone is reported by decision machine 29 over line 38 to filter 21 while the predominant high tone is reported by decision machine 35 over line 37 to filter 22.

The operation of DTMF receiver 20 along with the IIR filter of FIG. 1 will now be described in more detail with respect to resonator 32 which is a 770 Hertz tone resonator. When decision machine 35 reports that resonator 32 is the most active one in the low band, the value of the multipliers 15, 16, 18 and 19 of FIG. 1 comprising filter 21 are selected so as to attenuate very severely the 770 Hertz tone. The 770 Hertz tone, by the operation of the filter of FIG. 1, is subsequently inhibited from reaching the high band limiter and high band resonators. During the first few milliseconds of reception of a true DTMF tone at input 30, noise and settling of AGC 23 may cause some uncertainty as to which one of resonators 25 through 27 and 31 through 34 is dominant. Since decision machines 29 and 35 may report that a different resonator is dominant for every input sample time, filters 21 and 22 may change their characteristics, that is, have different values for multipliers 15, 16, 18 and 19, for every input sample time. Since each set of values for multipliers 15, 16, 18 and 19 has been chosen so as to provide that the z-plane locus between the poles of each chosen set lies within the unit circle at all points, no instability in operation results.

While the invention has been particularly shown and described with reference to a preferred embodiment thereof, it will be understood by those skilled in the art that the foregoing and other changes in form and detail will be made therein without departing from the spirit and scope of the invention.

What is claimed is:

1. A filter for suppressing energy at time varying frequencies, comprising:
   at least two multiplier sections the first of said two multipliers sections being connected in a feedback path between the output and an input of a first adder and the second being connected between a delayed output of said just adder and said input thereof; and,
   means for dynamically varying said at least two multiplier sections for operation between at least two time varying frequencies, whereby said filter dynamically supresses energy at said at least two time varying frequencies.

2. A filter according to claim 1 wherein each of said at least two multiplier sections comprises a multiplier, the output of the multiplier of each of said at least two multiplier sections connected to such input of said adder.

3. A filter according to claim 2 wherein each of said at least two multiplier sections further comprises a delay block, a first delay block connected between the output of said first adder and the input of a first multiplier, a second delay block connected between the input of said first multiplier and the input of a second multiplier.

4. A filter according to claim 2 further comprising at least two additional multiplier sections each of which is connected in a forward path between a first and a second input of a second adder, the first input of said second adder being connected to the output of said first adder.

5. A filter according to claim 4 wherein each of said at least two additional multiplier sections comprises a multiplier having its output connected to the second input of said second adder, the input of the multiplier of each of said at least two additional multiplier sections being connected to the input of one of the multipliers in the multiplier sections connected in the feedback path.

6. A filter according to claim 4 further comprising means for dynamically varying said at least two additional multiplier sections for operation between at least said two time varying frequencies, whereby said filter dynamically suppresses energy at said at least two time varying frequencies.

7. A filter according to claim 6 wherein said means for dynamically varying said at least two additional multiplier sections comprises means for selecting at least a first and a second set of values for said at least two additional multiplier sections, said at least two sets of values having poles lying within the unit circle of the z-plane locus.

* * * * *